(12) United States Patent
Mutsuji

(10) Patent No.: US 8,899,402 B2
(45) Date of Patent: Dec. 2, 2014

(54) POSITIONING JIG AND METHOD OF ADJUSTING POSITION

(71) Applicant: Senju Metal Industry Co., Ltd., Tokyo (JP)

(72) Inventor: Toshihiko Mutsuji, Saitama (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 0 days.

(21) Appl. No.: 14/067,660

(22) Filed: Oct. 30, 2013

(65) Prior Publication Data

US 2014/0116847 A1 May 1, 2014

(30) Foreign Application Priority Data

Oct. 31, 2012 (JP) ................................ 2012-241259

(51) Int. Cl.
| | | |
|---|---|---|
| B65G 47/22 | (2006.01) | |
| B65G 47/24 | (2006.01) | |
| H01L 21/687 | (2006.01) | |
| H01L 21/68 | (2006.01) | |

(52) U.S. Cl.
CPC .......... *B65G 47/24* (2013.01); *H01L 21/68728* (2013.01); *H01L 21/68* (2013.01); *H01L 21/6875* (2013.01); *Y10S 414/136* (2013.01)
USPC .................... 198/345.1; 198/341.05; 414/936

(58) Field of Classification Search
USPC ................... 198/341.05, 345.1, 345.2, 346.3; 414/936
See application file for complete search history.

(56) References Cited

U.S. PATENT DOCUMENTS

| | | | | |
|---|---|---|---|---|
| 3,645,581 A | * | 2/1972 | Lasch et al. ................ | 198/345.1 |
| 4,058,223 A | * | 11/1977 | Cruse .......................... | 198/345.1 |
| 5,692,873 A | * | 12/1997 | Weeks et al. ................ | 414/936 |
| 7,458,762 B2 | * | 12/2008 | Han et al. .................... | 414/936 |
| 7,516,833 B2 | * | 4/2009 | Todaka ....................... | 198/345.1 |

(Continued)

FOREIGN PATENT DOCUMENTS

| | | |
|---|---|---|
| JP | S62-026037 | 5/1987 |
| JP | H06-151550 | 5/1994 |

OTHER PUBLICATIONS

Patent Abstracts of Japan; English translation of Abstract of publication No. 06-151550 listed above; document obtained from URL http://www19.ipdl.inpit.go.jp/PA 1/resultidetaii/main/w1Jae/Ua/0A406151550P1 on Aug. 7, 2013.

(Continued)

*Primary Examiner* — James R Bidwell
(74) *Attorney, Agent, or Firm* — Chernoff Vilhauer McClung & Stenzel LLP

(57) ABSTRACT

A positioning jig has a circular part with a diameter that is identical with a diameter of a semiconductor wafer and knock-pins for connecting a periphery of base plate around an opening in a base plate of a conveying tool for a semiconductor wafer. These knock-pins are respectively provided in four blades protruded from predetermined positions of the circular portion at least three directions. When adjusting the projection positions of supporting plates, the knock-pins are fitted into the opening of the base plate of the conveying tool for the semiconductor wafer. The supporting plates moves so that the knock-pins come into contact with an outer edge of the circular part of the prepared positioning jig. The adjusted supporting plates are then fixed on the base plate. The semiconductor wafer is mounted on the adjusted and fixed supporting plates so that the semiconductor wafer is positioned.

3 Claims, 9 Drawing Sheets

(56) References Cited

U.S. PATENT DOCUMENTS

| | | | |
|---|---|---|---|
| 8,132,660 B2* | 3/2012 | Park et al. | 198/345.1 |
| 8,462,009 B2* | 6/2013 | Lee | 414/936 |
| 2005/0016818 A1* | 1/2005 | Ito et al. | 198/345.1 |

OTHER PUBLICATIONS

Unattributed English translation of Abstract of Japanese application S62-026037 listed above.

* cited by examiner h3>h1≧h2

POSITIONING JIG AND METHOD OF
ADJUSTING POSITION

CROSS-REFERENCE TO RELATED APPLICATIONS

The present invention is based on Japanese Patent Application No. 2012-241259 filed with Japanese Patent Office on Oct. 31, 2012, the entire contents of which being hereby incorporated by reference.

BACKGROUND OF THE INVENTION

1. Field of the Invention

The present invention relates to a positioning jig and a method of adjusting a position, which are applicable to a tray (conveying tool) for conveying a semiconductor wafer when mounting the semiconductor wafer to be heated thereon and carrying the semiconductor wafer to a reflow furnace.

2. Description of Related Art

A special-purpose conveying tool has been used during semiconductor manufacturing steps such as a heat treatment step and a conveying line in the past and has conveyed many semiconductor wafers (hereinafter, simply referred to as "wafer" in case of need). The sizes of wafers to be conveyed have been often different from each other in different semiconductor manufacturing steps. Accordingly, each time the size of wafer varies, the conveying tool has been changed.

In order to exclude such a change step of the conveying tool, a conveying tool which can convey wafers having a plurality of sizes has been known (see Japanese Patent Application Publication No. H06-151550 and Japanese Utility Model Application Publication No. S62-026037). Japanese Patent Application Publication No. H06-151550 has disclosed a wafer fork. In such a wafer fork, holding pins are set in setting holes of a wafer fork body due to diameters of the wafers to be conveyed. This enables the wafers having a plurality of sizes to be conveyed.

Japanese Utility Model Application Publication No. S62-026037 has disclosed a wafer-holding table. By such a wafer-holding table, a conveying beam which moves upward or downward and horizontally by means of a vertical cylinder and a horizontal cylinder conveys wafers.

On the wafer-holding table, pins supporting the wafer have at least three species of heights. A group of the pins having the same height is arranged around the same circumference. The groups of the pins which have different heights are arranged around the same circumferences in order of height outward so that the group of pins having the height corresponding to each of the sizes of the wafer can support the wafer having the corresponding size. The wafer is positioned by allowing it to contact the group of pins having a height with next higher level to that of the group of pins supporting the wafer.

FIG. 1 shows another conveying tool 300 of related art for a semiconductor wafer, which is applicable to a case of conveying the wafers having a plurality of sizes. In the conveying tool 300 for the semiconductor wafer shown in FIG. 1, a base plate 31 and conveying guides 32 are fastened by bolts 34 and the like.

The base plate has an opening 35, which has a diameter that is smaller than a diameter of the wafer W1, at its middle. Three pins 36A, 36B, and 36C for supporting the wafer W1 are arranged around the same circumference on the base plate 31 and three guides 37A, 37B and 37C for preventing misalignment of the wafer W1 are arranged around the same circumference.

Further, three pins 38A, 38B and 38C for supporting the wafer W2 having a diameter that is larger than the diameter of the wafer W1 are arranged around the same circumference on the base plate 31 and three guides 39A, 39B and 39C for preventing misalignment of the wafer W2 are arranged around the same circumference.

SUMMARY OF THE INVENTION

However, regarding the wafer fork disclosed in Japanese Patent Application Publication No. H06-151550, the wafer-holding table disclosed in Japanese Utility Model Application Publication No. S62-026037 and the conveying tool 300 for semiconductor wafer shown in FIG. 1, when heating the wafer, heat is escaped from a part of the wafer overlapping with the wafer fork, the wafer-holding table and the base plate 31 surrounding the opening 35 in the conveying tool 300 for semiconductor wafer to the wafer fork, the wafer-holding table and the base plate 31. This causes this part of the wafer to be less heat-transferred as compared with the other part of the wafer not overlapping therewith.

Further, in the above-mentioned wafer fork, the above-mentioned wafer-holding table and the conveying tool 300 for semiconductor wafer, there is also a case where an operator may cause any misalignment when mounting the wafer on them so that a positioning of the wafer is not satisfactory.

This invention addresses the above-mentioned issues and has an object to provide a positioning jig and a method of adjusting a position, by which the conveying tool for the semiconductor wafer can support the wafer with good reproducibility at a position where a center of the wafer aligns a center of the opening of the conveying tool main body when mounting the wafer on supporting members of the conveying tool for the semiconductor wafer.

To achieve the above-mentioned object, a positioning jig reflecting one aspect of the present invention is used when adjusting projection positions of supporting members that support a semiconductor wafer having a predetermined dimension into a circular opening of a conveying tool for conveying the semiconductor wafer. The conveying tool includes a conveying tool main body containing the opening which has a larger diameter than a diameter of the semiconductor wafer, and the supporting members for supporting the semiconductor wafer in a concentric fashion at the projection positions projected from an inner edge of the conveying tool main body into the opening. The supporting members are at least three supporting members and constitute a position adjusting mechanism. Each supporting member has a predetermined length, is provided with a plurality of pins arranged thereon corresponding to the diameter of the semiconductor wafer, and is slidably arranged on the conveying tool main body on a straight line toward a center of the opening. The positioning jig contains a positioning jig main body including a circular part with a diameter that is identical with the diameter of the semiconductor wafer and plural protrusion parts protruded from predetermined positions of the circular part to at least three directions, and projection portions being respectively provided in the protrusion parts and connecting a periphery portion of the conveying tool main body around the opening. Each of the projection portions is arranged at a position that is away from a center of the circular part by a distance that is longer than a radius of the opening. When adjusting the projection positions of the supporting members so that the pins come into contact with an outer edge of the circular part, the projection portions are installed into the periphery portion of the conveying tool main body.

It is also desirable to provide the positioning jig wherein each of the projection portions is a stepped pin which includes a first stepped portion caught by the periphery portion of the conveying tool main body around the opening and a second stepped portion fitted into the opening of the conveying tool main body along the inner edge of the conveying tool main body.

Further, to achieve the above-mentioned object, a method of adjusting projection positions of supporting members that support a semiconductor wafer having a predetermined dimension into a circular opening of such a conveying tool for conveying the semiconductor wafer, reflecting another aspect of the present invention, contains the steps of preparing a positioning jig containing a positioning jig main body including a circular part with a diameter that is identical with the diameter of the semiconductor wafer and plural protrusion parts protruded from predetermined positions of the circular part to at least three directions, and projection portions being respectively provided in the protrusion parts and connecting a periphery portion of the conveying tool main body around the opening, wherein each of the projection portions is arranged at a position that is away from a center of the circular part by a distance that is longer than a radius of the opening, installing the prepared positioning jig into the periphery portion of the conveying tool main body, adjusting the projection positions of the supporting members so that the pins come into contact with an outer edge of the circular part of the installed positioning jig, and fixing the adjusted supporting members on the conveying tool main body.

The concluding portion of this specification particularly points out and directly claims the subject matter of the present invention. However, those skilled in the art will best understand both the organization and method of operation of the invention, together with further advantages and objects thereof, by reading the remaining portions of the specification in view of the accompanying drawing(s) wherein like reference characters refer to like elements.

The foregoing and other objectives, features, and advantages of the invention will be more readily understood upon consideration of the following detailed description of the invention taken in conjunction with the accompanying drawings.

BRIEF DESCRIPTION OF THE SEVERAL DRAWINGS

DETAILED DESCRIPTION OF PREFERRED EMBODIMENTS

Hereinafter, typical embodiments of this invention will be explained with reference to the drawings. It should be noted that the present invention is not limited to the embodiments described below. Definitions of terms described below are given by way of explanation of the terms only, and thus the definitions of the terms of the invention are not limited thereto.

Figure 2:
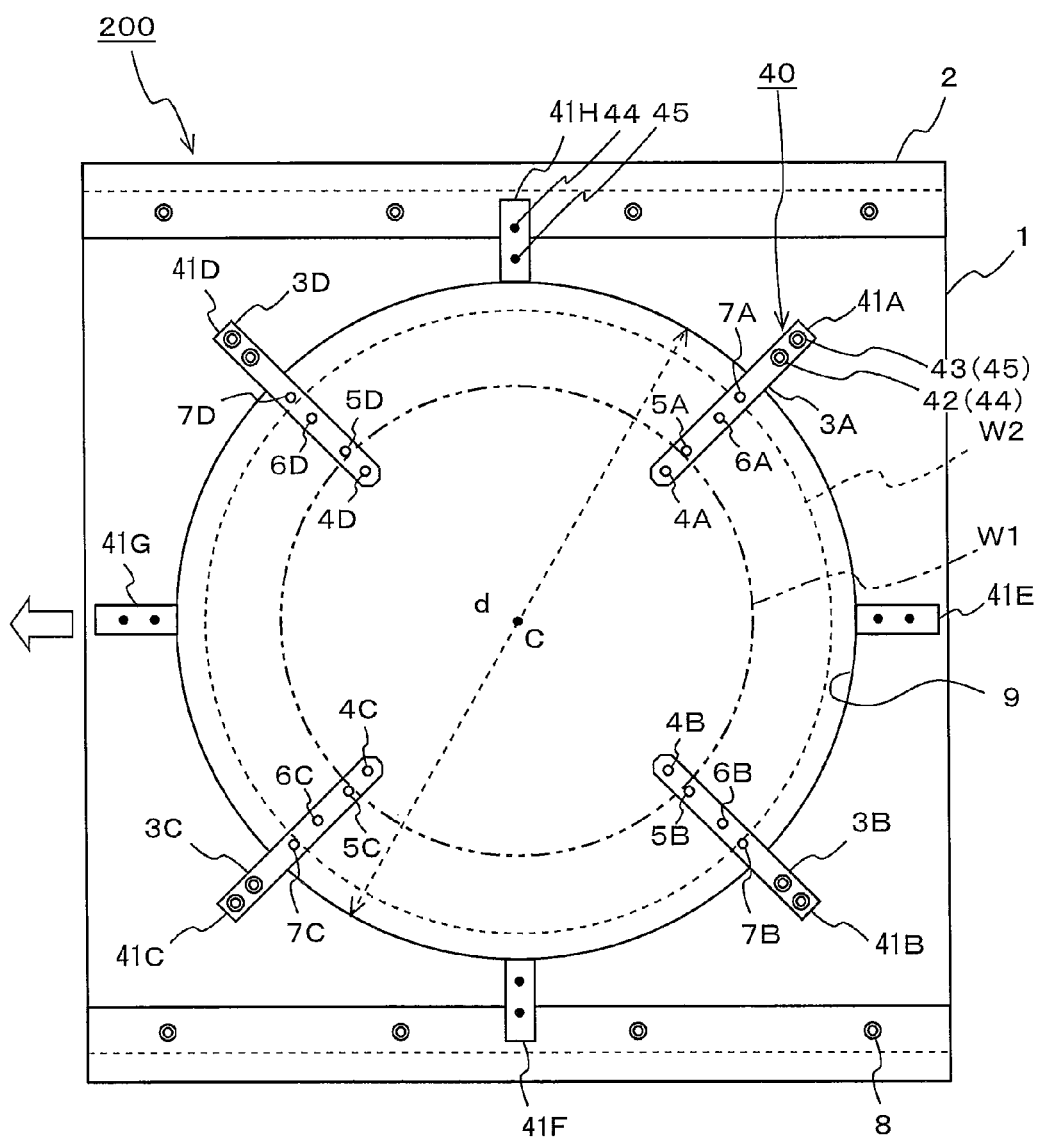
FIG. 2 is a top plan view of a conveying tool for a semiconductor wafer for showing a configuration example thereof.

The inventors have found out a configuration of a conveying tool for a semiconductor wafer, which can realize that a surface of the semiconductor wafer is uniformly heated when heating the wafer (see FIG. 2).

Figure 1:
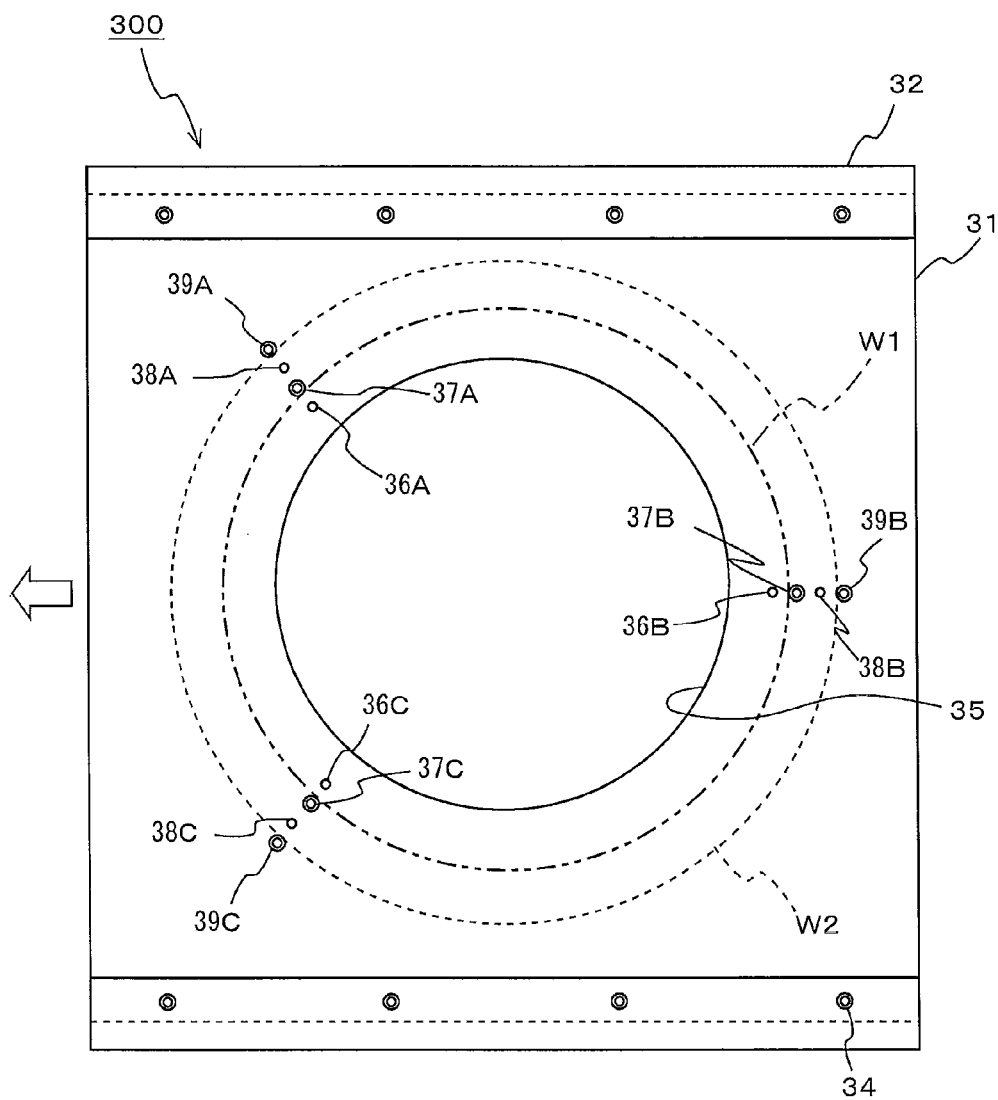
FIG. 1 is a top plan view of a conveying tool for a semiconductor wafer according to related art for showing a configuration example thereof.

According to the conveying tool 200 for a semiconductor wafer, shown in FIG. 2, in order to realize that the surface of the semiconductor wafer is uniformly heated, a base plate 1 is provided with an opening 9 having a larger diameter than that of the opening 35 in the conveying tool 300 for the semiconductor wafer, shown in FIG. 1. This opening 9 has a diameter d that is larger than a diameter $\phi$ of the largest semiconductor wafer to be handled in the conveying tool 200 for the semiconductor wafer. The conveying tool 200 for the semiconductor wafer contains the base plate 1 for conveying the semiconductor wafer shown by the two-dot chain line in FIG. 2 and four supporting plates 3A, 3B, 3C and 3D (hereinafter, symbols A, B, C and D may be omitted).

The supporting plate 3A is provided with a pin 4A for supporting the semiconductor wafer W1 and a pin guide 5A for preventing any misalignment and supporting it. The supporting plates 3B through 3D are also provided with similar pins 4B through 4D and pin guides 5B through 5D (hereinafter, symbols may be omitted). Further, the supporting plates 3 are provided with pins 6 for supporting a semiconductor wafer W2 that has a diameter larger than the diameter of the semiconductor wafer W1 and pin guides 7 for preventing any misalignment and supporting it. The supporting plates 3 respectively have position adjusting mechanisms 40 on the base plate 1 and the supporting plates 3 are configured to adjust their positions so that the semiconductor wafer W1 or W2 can be supported at projection positions projected from an inner edge of the base plate 1 around the opening 9.

The position adjusting mechanism 40 is constituted of any one of eight grooves 41A through 41H (hereinafter, symbols A through H may be omitted), two fixing screws 42 and 43 for every groove 41 and female screws 44 and 45. Although, in an example shown in FIG. 2, the position adjusting mechanism 40 includes eight grooves 41A through 41H for every 45 degrees, four grooves 41A through 41D for every 90 degrees, which are selected from the eight grooves, are used corresponding to the supporting plates 3A through 3D and the position adjusting mechanisms 40 are provided thereon.

The grooves 41 are radially arranged on the base plate 1 toward a center C of the opening 9. Each groove has a straight line shape. Two female screws 44 and 45 are provided in each of the grooves 41. In each of the grooves 41A through 41D, the fixing screws 42 and 43 screw the corresponding female screws 44 and 45. Apertures in the each of the supporting plates 3 into which the fixing screws 42 and 43 are fitted are formed like long apertures. Such long apertures allow the supporting plate 3 to be slid along the groove 41.

By the way, in the conveying tool 200 for the semiconductor wafer, when an operator adjusts the supporting plates 3 by the position adjusting mechanisms 40, a subtle misalignment may occur in the semiconductor wafer by the operator performing such an adjusting operation even if the pins 4 and 6 and the pin guides 5 and 7 provided on the each of the supporting plate 3 of the conveying tool 200 for the semiconductor wafer are settled with high accuracy.

In the other words, when adjusting the supporting plates by the position adjusting mechanism 40, the center C of the semiconductor wafer may misalign the center C of the conveying tool 200 for the semiconductor wafer. In such a misaligning case, the center C of the semiconductor wafer is deviated from the center C of the conveying tool 200 for the semiconductor wafer so that the surface of the semiconductor wafer is not uniformly heated.

Figure 3:
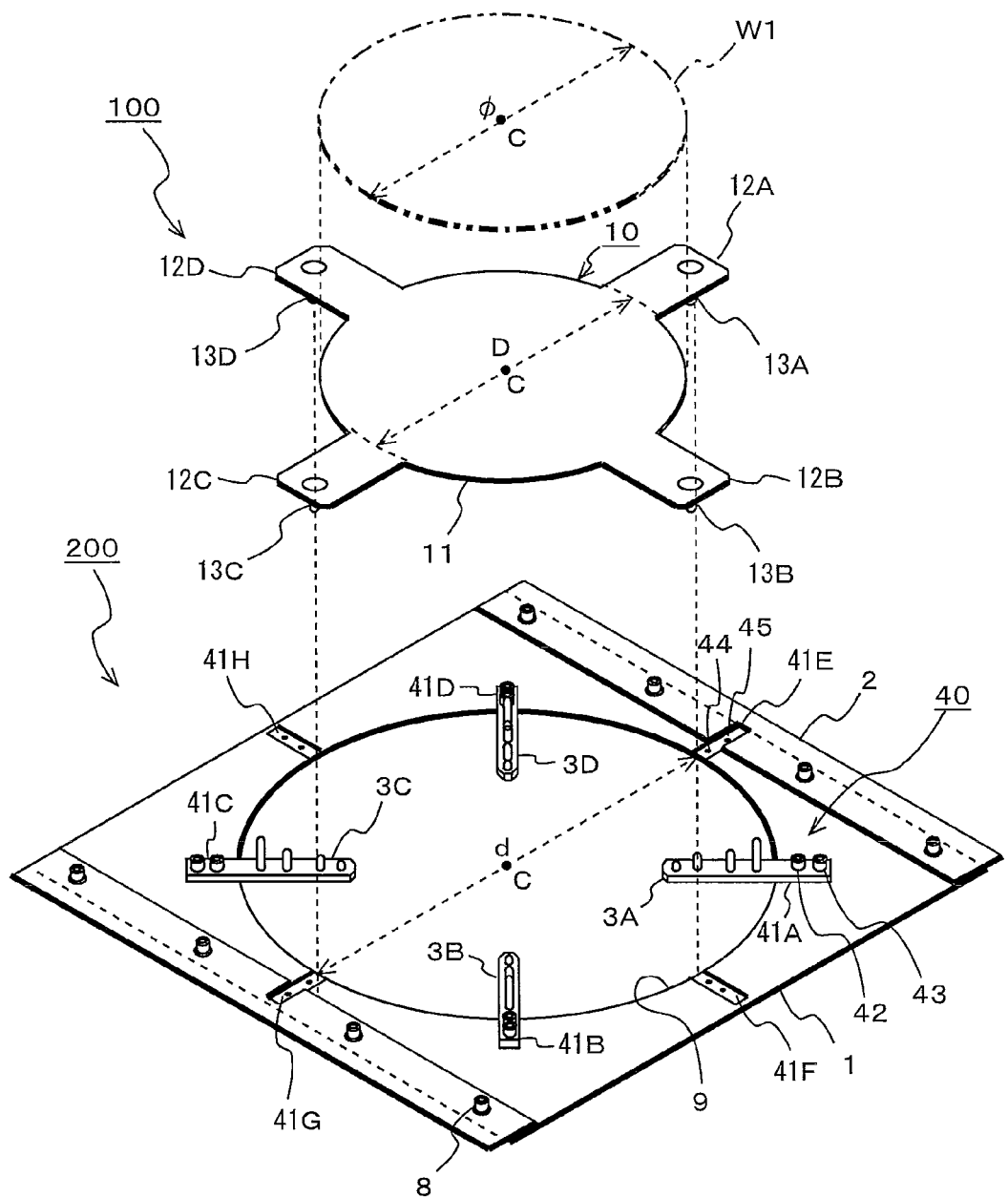
FIG. 3 is a perspective view of a positioning jig according to a first embodiment of the invention for a conveying tool for a semiconductor wafer for showing a configuration example thereof.

The positioning jig 100 shown in FIG. 3 address the issue and can support the semiconductor wafer with good reproducibility at a position where the center of the wafer aligns the center of the opening 9 in the conveying tool 200 for the semiconductor when mounting the wafer on the supporting plates 3 in the conveying tool 200 for the semiconductor.

The positioning jig 100 shown in FIG. 3 positions the semiconductor wafer W1 having a diameter $\phi$ of 150 mm and is used when adjusting the projection position of each of the four supporting members into the opening 9 of the conveying tool 200 for the semiconductor wafer.

The conveying tool 200 for the semiconductor wafer conveys the semiconductor wafer W1 shown by two-dot chain line in FIG. 3 and has a base plate 1 (conveying tool main body) and the four supporting plates 3A, 3B, 3C and 3D (hereinafter, symbols may be omitted), which is one example of at least three supporting members. The base plate 1 is provided with the opening 9 having a diameter d which is larger than the diameter $\phi$ of the semiconductor wafer with the largest dimension. When the diameter $\phi$ of the semiconductor wafer W1, W2 or W3 with the predetermined dimension is set to 150 mm, 200 mm or 300 mm, the diameter d of the opening 9 is, for example, about 310 mm.

The following will describe the positioning tool 100 for the semiconductor wafer W1 having the diameter $\phi$ of 150 mm as described above.

The supporting plates 3 have the position adjusting mechanisms 40 on the base plate 1 and are configured to support the semiconductor W1 at projection positions projected from an inner edge of the base plate 1 around the opening 9. The position adjusting mechanism 40 is constituted of any one of the eight grooves 41A through 41H, two fixing screws 42 and 43 and female screws 44 and 45 which the fixing screws screw. Although eight grooves 41A through 41H are provided for every 45 degrees so that eight position adjusting mechanisms 40 can be provided therein, four grooves 41A through 41D (hereinafter, symbols may be omitted) for every 90 degrees, which are selected from the eight grooves, are used corresponding to the supporting plates 3A through 3D in this embodiment. The description of position adjusting mechanism 40 will be omitted because of the above-mentioned detailed description thereof.

The positioning jig 100 has a positioning jig main body 10 with complex shapes of a circle and a cross, which is cut from one piece of flat plate. The positioning jig main body 10 includes a circular part 11 with a diameter D that is identical with the diameter $\phi$ of the semiconductor wafer W1. The diameter D of the circular part 11 has the same diameter as the diameter $\phi$, 150 mm, of the semiconductor wafer W1. However, in this embodiment, the diameter D is set to 150.8 mm. This is because there is a tolerance such that, in a case of the semiconductor wafer W1 with the diameter $\phi$ of 150 mm, the diameter $\phi$ thereof is within a range of 150.5 mm through 151 mm and the diameter D of the circular part 11 is set to a middle of the tolerance. Similarly, in a case of the semiconductor wafer W2 or W3 with the diameter $\phi$ of 200 mm or 300, there is a tolerance such that the diameter $\phi$ thereof is within a range of 200.5 mm through 201 mm or 300.5 mm through 301 mm. The diameter D of the circular part 11 that is larger than the diameter $\phi$ of the semiconductor wafer is because, if the diameter D of the circular part 11 is not larger than the diameter $\phi$ of the semiconductor wafer, a robot or the like may be difficult to mount the semiconductor wafer automatically without any clearance when mounting the semiconductor wafer on the supporting plates 3. As the flat plate, any metal materials such as stainless plate (SUS) or aluminum plate (Al) are used.

The positioning jig main body 10 also include four blades 12A; 12B, 12C and 12D (hereinafter, symbols may be omitted), which constitute plural protrusion parts protruded from predetermined positions of the circular part to at least three directions. In this embodiment, the blades 12A through 12D are protruded from predetermined positions of the circular part 11 to four directions (for every 90 degrees ($\theta$1)). See FIG. 4.

Figure 4:
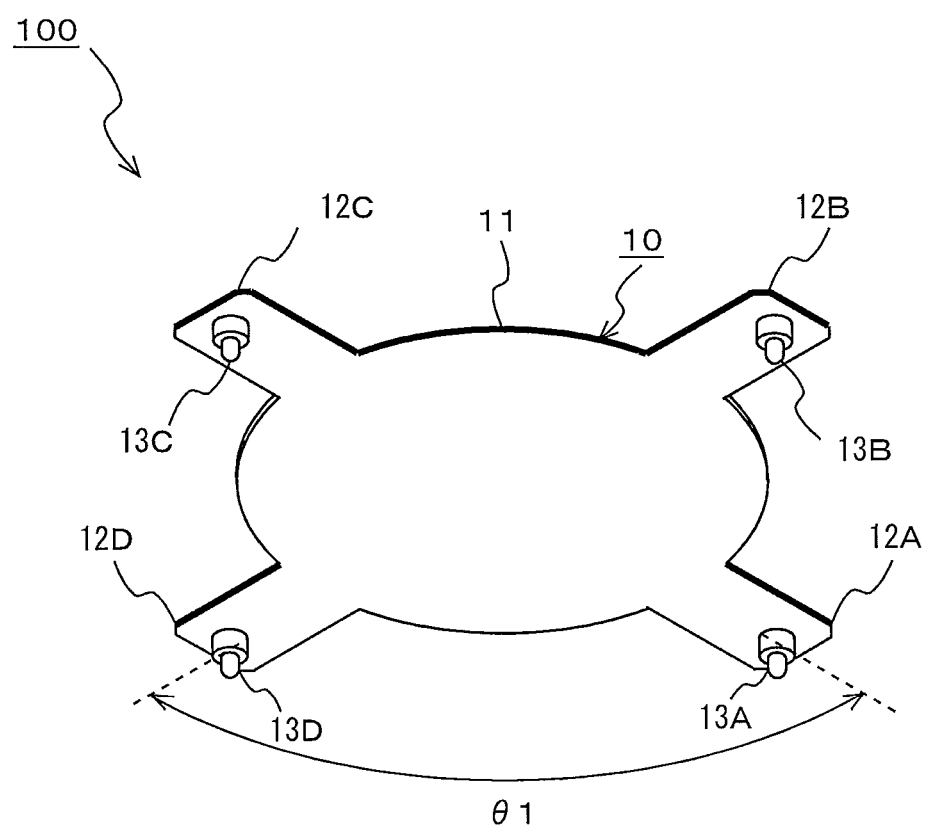
FIG. 4 is a perspective view of the positioning jig according to the first embodiment of the invention shown from a back side thereof.
Figure 6:
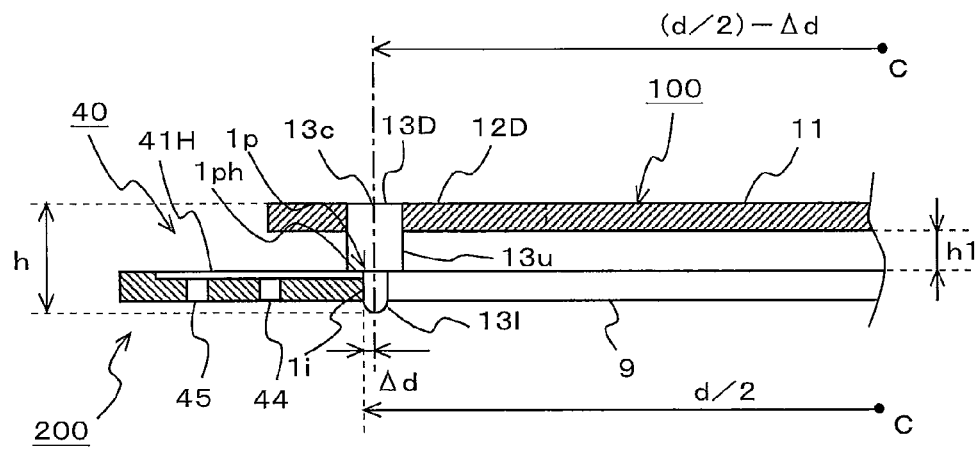
FIG. 6 is a cross section showing a configuration example and a functional example of a knock-pin and the like, taken along lines x1-x1 shown in FIG. 5.

Knock-pins 13A through 13D (hereinafter, symbols may be omitted) constituting projection portions are respectively provided in the blades 12 to connect a periphery portion 13$p$ of the base plate 1 around the opening 9. Each of the knock-pins 13 is arranged at a position that is away from a center C of the circular part 11 by a distance that is longer than a radius of the opening 9, and when adjusting the projection positions of the supporting plates 3 so that the knock-pins 13 come into contact with an outer edge of the circular part 11, the knock-pins 13 of the blades 12 are installed into the periphery portion 1$p$ of the base plate 1, in this embodiment, the knock-pins 13 are fitted into the opening 9. As each of the knock-pins 13, a stepped pin shown in FIGS. 4 and 6 is used. The knock-pins 13 is made of the same metal materials as those of the positioning jig main body, for example, SUS or Al.

Each of the knock-pins 13 has a predetermined height h and includes a first stepped portion 13$u$ caught by the periphery 1$ph$ of the base plate 1 around the opening 9, an upper part of which is pressed into the blade 12D, and a second stepped portion 13$l$ fitted into the opening 9 of the base plate 1 along the inner edge of the base plate 1. A homogenous height h1 of the knock-pin 13 is set at four positions excluding the upper part of the knock-pin 13 which is pressed into the blade 12. The knock-pins 13 are set to the same height so that the main body 10 of the positioning jig 100 can make even a height from the base plate 1 of the conveying tool 200 for the semiconductor wafer. In other words, this allows the positioning jig main body 10 to be kept parallel with the base plate 1. Further, the knock-pins 13 are fitted into the opening 9 by pressing the knock-pins 13 against the inner edge of the base plate 1 around the opening 9, in order to prevent the knock-pins 13 from wobbling when installing the positioning jig 100 into the conveying tool 200 for the semiconductor wafer.

The following will describe a method of adjusting projection positions of the supporting plates that support a semiconductor wafer according to the embodiment of the invention, using the positioning jig 100, with reference to FIGS. 5 through 8. In this embodiment, it is supposed that in the conveying tool 200 for the semiconductor wafer in which the base plate 1 is provided with the opening 9 having a diameter d of about 310 mm that is larger than the diameter φ of 300 mm of the semiconductor wafer W3, the supporting plates 3 have the position adjusting mechanism 40 on the base plate 1 and at least three supporting plates, in this embodiment, four supporting plates 3A through 3D support the semiconductor wafer W3 at the positions projected from the inner edge 1i of the base plate 1 into the opening, the projection positions of supporting plates 3A through 3D into the opening 9 are adjusted.

Under these adjustment conditions, the positioning jig 100 according to the embodiment of the invention shown in FIG. 4 is prepared (Step 1). The following will describe a preparation method of the positioning jig 100. For example, on the one hand, a flat plate such as stainless plate or aluminum plate having a predetermined thickness is prepared. The circular part 11 with the diameter D is cut from the flat plate so that the diameter D is identical with the diameter φ of the semiconductor wafer W1 and the blades 12A through 12D are also cut from the flat plate so that the blades 12A through 12D are protruded from predetermined positions of the circular part 11 to four directions for every 90 degrees. Thus, the positioning jig main body 10 is formed.

On the other hand, the stepped knock-pins 13A through 13D shown in FIGS. 4 and 6 are prepared. Thereafter, pin holes are perforated in the blades 12A through 12D. The perforated position of each of the pin holes is set so that a center 13c thereof is positioned from the center C of the circular part 11 at a position calculated by a numerical formula, (d/2)−Δd wherein d/2 is a length which is the same as the radius of the opening 9 and Δd is a radius of a rod portion, the second stepped portion 13l of the knock-pin 13D.

After the perforated position of each of the pin holes is set, the holes are perforated using a drill machine and the knock-pins 13 are respectively pressed into the perforated pin holes. This enables the knock-pin 13A to be arranged at a position that is away from the center C of the circular part 11 by a distance that is longer than the radius of the opening 9. Similarly, other knock-pins 13B through 13D are respectively arranged in the corresponding blades 12B through 12D. Thus, the positioning jig 100 is formed.

Figure 5:
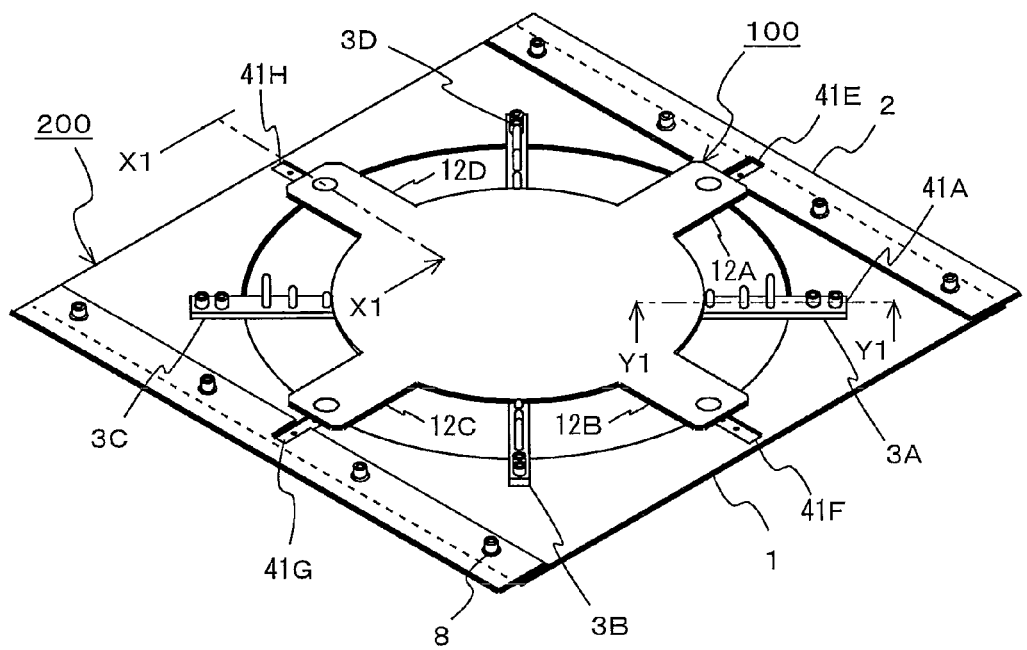
FIG. 5 is a perspective view of the positioning jig according to the first embodiment of the invention for showing a fitted example thereof.

Next, the prepared positioning jig 100 is fit into the opening 9 of the base plate 1 in the conveying tool 200 for the semiconductor wafer (Step 2). In this embodiment, the positioning jig 100 falls down to the conveying tool 200 for the semiconductor wafer as shown in FIG. 3 and the positioning jig 100 is fitted into the opening 9 of the base plate 1 in the conveying tool 200 for the semiconductor wafer as shown in FIG. 5.

In this moment, each of the knock-pins 13 connects a periphery portion 1p including the periphery 1ph and an inner edge 1i of the base plate 1 around the opening 9. In this embodiment, the upper portion 13u of the knock-pin 13 having the height h is caught by the periphery 1ph of the base plate 1 around the opening 9 and the lower portion 13l is fitted into the opening 9 of the base plate 1 along the inner edge 1i of the base plate 1. This allows the positioning jig 100 to be installed into the periphery portion 1p of the base plate 1 in the conveying tool 200 for the semiconductor wafer. Anyone can install or fit (or assemble) the positioning jig 100 with ease without requiring any special technical skill or experience.

Figure 7:
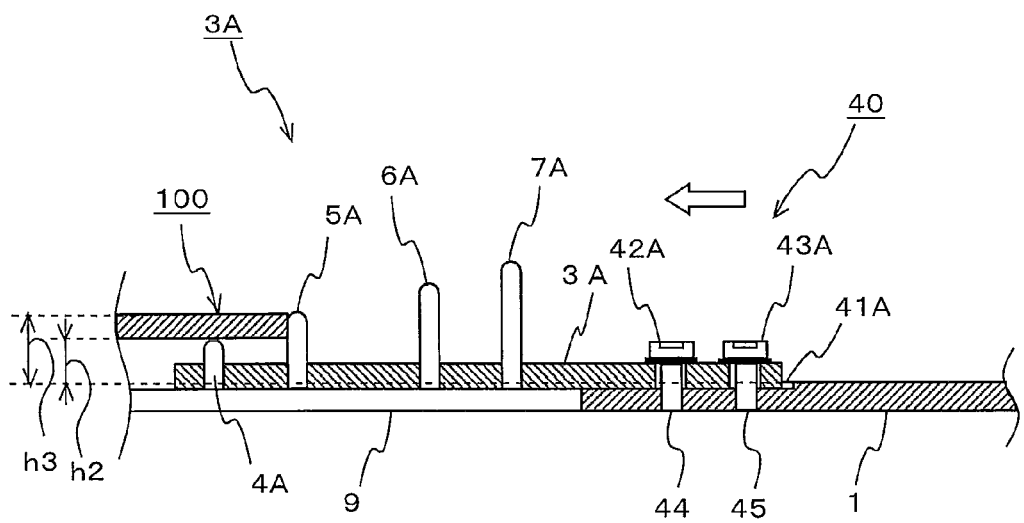
FIG. 7 is a cross section showing a functional example of a position adjusting mechanism of a supporting plate, taken along lines y1-y1 shown in FIG. 5.

It is to be noted that when setting the supporting plates 3 on the base plate 1 using the positioning jig 100, in order to perform the positioning operation easily and surely with high accuracy, the scape h1 between a lower surface of the positioning jig 100 and an upper surface of the base plate 1 is set to become a relationship of h3>h1≥h2 wherein h2 is a height of the pin 4A for supporting the semiconductor wafer W1 from the base plate 1 and h3 is a height of pin guide 5A from the base plate 1 (see FIG. 7).

The projection positions of the supporting plates 3 are then adjusted so that the pin guides 5 come into contact with the outer edge of the circular part 11 of the positioning jig 100 fitted into the opening 9 of the conveying tool 200 for the semiconductor wafer (Step 3). In this embodiment, by loosening the two fixing screws 42A and 43A in the supporting plate 3A shown in FIG. 7, the supporting plate 3A can be slid against the base plate 1 along the groove 41A.

Next, the supporting plate 3A is adjusted so that the supporting plate 3A is slid along the groove 41A until the pin guides 5 for preventing the misalignment of the semiconductor wafer and supporting the semiconductor wafer come into contact with the outer edge of the circular part 11 of the positioning jig 100. When the pin guide 5A for preventing the misalignment of the semiconductor wafer and supporting the semiconductor wafer comes into contact with the outer edge of the circular part 11 of the positioning jig 100, by fastening the two fixing screws 42A, 43A, the supporting plate 3A is fixed on the base plate 1 (Step 4). Similarly, in other three supporting plates 3B through 3D, the position adjusting mechanisms 40 are adjusted.

Accordingly, the four supporting plates 3A through 3D can be positioned with a high accuracy to the outer edge of the circular part 11 while the center C of the circular part 11 having a diameter that is identical with the diameter φ, 150 mm, of the semiconductor wafer W1 aligns the center C of the opening 9.

Figure 8:
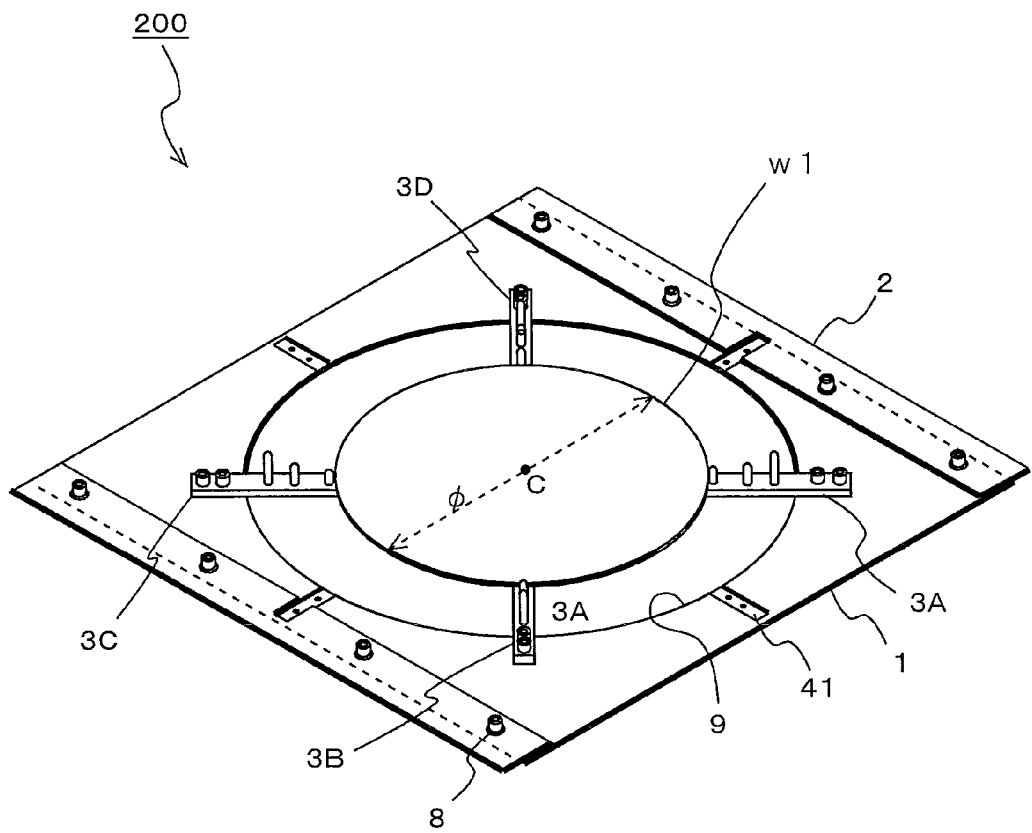
FIG. 8 is a perspective view of the conveying tool for the semiconductor wafer showing a mounted example of the semiconductor wafer.

Thereafter, the positioning jig 100 is removed from the conveying tool 200 for the semiconductor wafer shown in FIG. 5 and the semiconductor wafer W1 is mounted on the supporting plates 3A through 3D as shown in FIG. 8. This enables the semiconductor wafer W1 to be reproducibly supported at a position where the center C of the semiconductor wafer W1 aligns the center C of the opening 9 in the conveying tool 200 for the semiconductor wafer.

Figure 9:
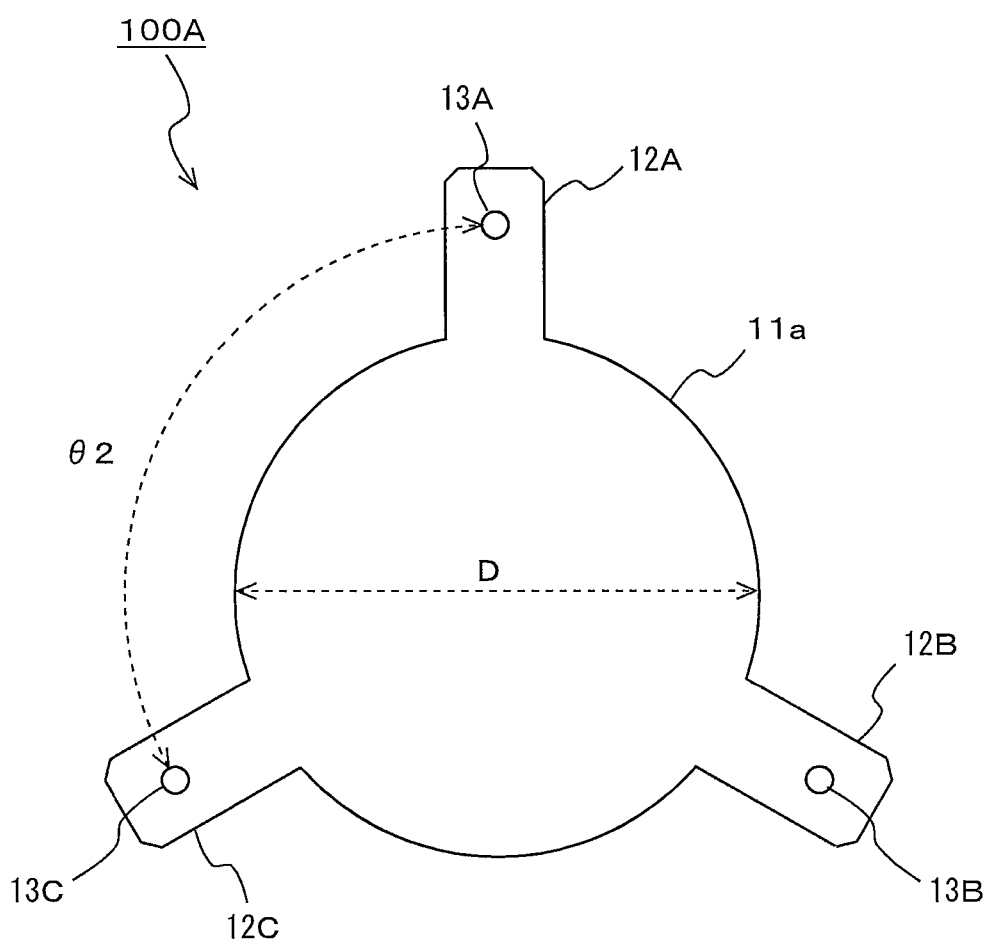
FIG. 9 is a top plan view of a positioning jig according to a second embodiment of the invention showing a configuration example thereof.
Figure 10:
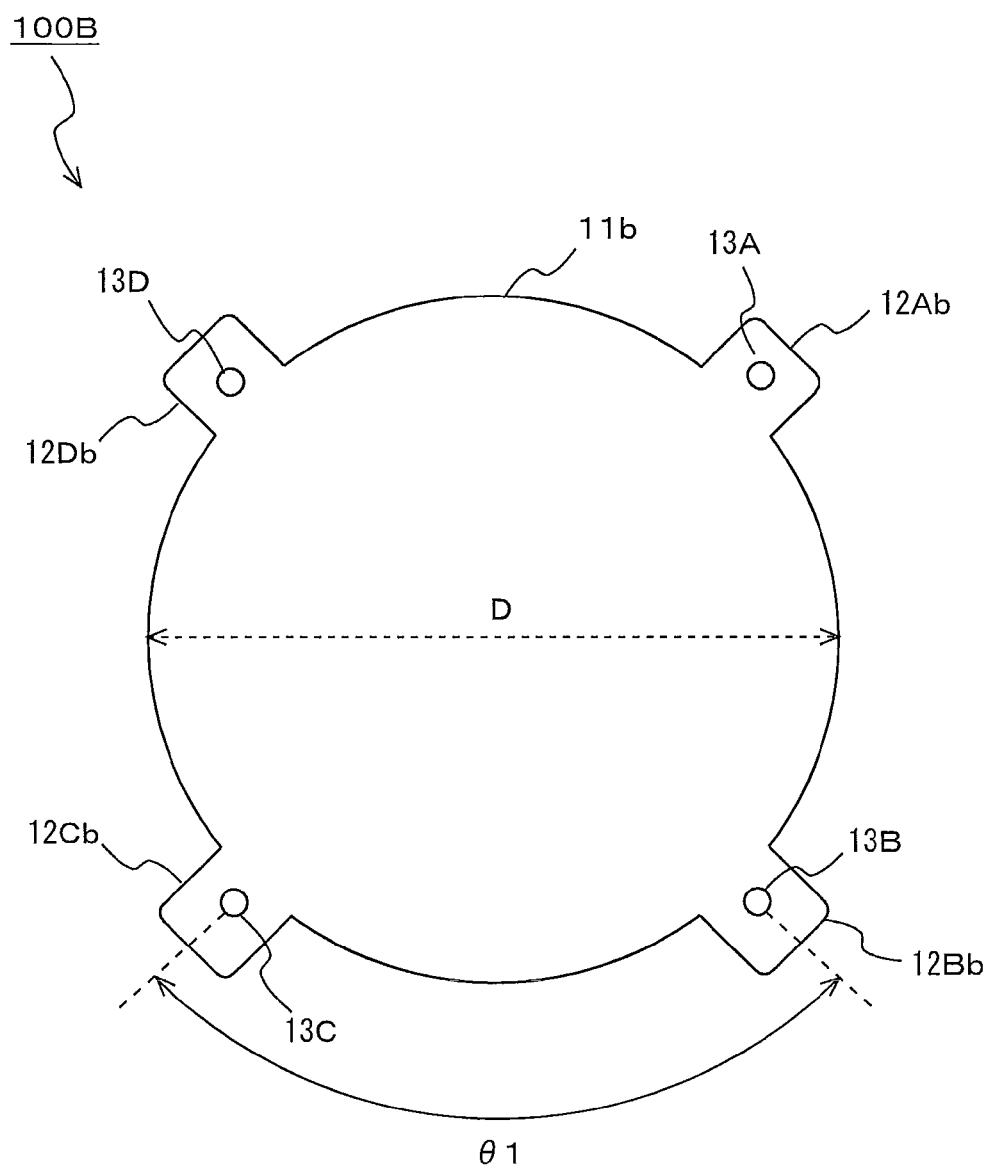
FIG. 10 is a top plan view of a positioning jig according to a third embodiment of the invention showing a configuration example thereof.

The following will describe positioning jigs 100A and 100B as second and third embodiments of the invention with reference to FIGS. 9 and 10. The positioning jig 100A shown in FIG. 9 has three blades 12A, 12B and 12C. These blades 12A, 12B and 12C are radially protruded from the circular part 11a with a diameter D of 150 mm for every 120 degrees (θ2). The knock-pins 13A through 13C are pressed into the corresponding positions of the blades 12A through 12C.

Such a positioning jig 100A also enables the four supporting plates 3A through 3D to be positioned with a high accuracy to the outer edge of the circular part 11a having a diameter that is identical with the diameter of the semiconductor wafer W1 while the center C of the circular part 11a aligns the center C of the opening 9 shown in FIG. 3.

The positioning jig 100B shown in FIG. 10 has four blades 12Ab, 12Bb, 12Cb, and 12Db. The diameter D of the circular part 11b is identical with the diameter φ of 300 mm in the semiconductor wafer W3. These blades 12Ab, 12Bb, 12Cb, and 12Db are radially protruded from the circular part 11b with a diameter D of 300 mm for every 90 degrees (θ1). The knock-pins 13A through 13D are pressed into the corresponding positions of the blades 12Ab, 12Bb, 12Cb, and 12Db.

Such a positioning jig 100B also enables the four supporting plates 3A through 3D to be positioned with a high accuracy to the outer edge of the circular part 11b having a diameter that is identical with the diameter φ of 300 mm in the semiconductor wafer W3 while the center C of the circular part 11b aligns the center C of the opening 9 shown in FIG. 3. A positioning jig having a circular part with a diameter that is identical with the diameter φ of 200 mm in the semiconductor wafer W2, not shown, may be formed.

Accordingly, in the positioning jig 100 and the method of adjusting a position according to the embodiments, the knock-pins 13 for connecting the periphery portion of the base plate 1 around the opening 9 are respectively provided in four blades 12A through 12 protruded from predetermined positions of the circular part 11 with a diameter that is identical with the diameter of the semiconductor wafer W1 to at least three directions. Each of these knock-pins 13 is arranged at a position that is away from the center C of the circular part 11 by a distance that is longer than a radius of the opening 9 in the base plate 1 of the conveying tool 200 for the semiconductor wafer, and when adjusting the projection positions of the supporting plates 3, the knock-pins 13 are fitted into the opening 9 of the base plate 1 of the conveying tool 200 for the semiconductor wafer.

Such a configuration enables the four supporting plates 3A through 3D to be positioned with a high accuracy to the outer edge of the circular part 11 while the center C of the circular part 11 having a diameter that is identical with the diameter φ, 150 mm, of the semiconductor wafer W1 aligns the center C of the opening 9. Thus, when mounting the semiconductor wafer W1 on the supporting plates 3A through 3D, the semiconductor wafer W1 can be reproducibly supported at a position where the center C of the semiconductor wafer W1 aligns the center C of the opening 9 in the conveying tool 200 for the semiconductor wafer.

Further, when the pins and the pin guides for preventing the misalignment, which respectively correspond to the semiconductor W2 having the diameter of 200 mm and the semiconductor W3 having the diameter of 300 mm, stand on the supporting plates 3A through 3D with high accuracy including any dimensional tolerance, it is possible to position the semiconductor W2 having the diameter of 200 mm and the semiconductor W3 having the diameter of 300 mm automatically by using only the positioning jig 100 for positioning the semiconductor wafer W1 having the diameter φ of 150 mm. This can cope with positioning of the three species of the semiconductor wafers W1, W2, and W3 by using only one positioning jig 100.

When positioning the supporting plates 3 to the base plate 1 by using the positioning jig 100 for the semiconductor W2 having the diameter of 200 mm and the semiconductor W3 having the diameter of 300 mm, the space between the lower surface of the positioning jig 100 and the upper surface of the base plate 1 may be set to become the above-mentioned relationship concerning the height of the pin for supporting the semiconductor wafer W2 or W3 from the base plate 1 and the height of pin guide from the base plate 1.

Although the method of fitting the knock-pins 13A through 13D into the opening 9 in the base plate 1 of the conveying tool 200 for the semiconductor wafer has been described, this invention is not limited thereto: Pin holes may be positioned in the base plate 1 with high accuracy and perforated at these positions, the knock-pins 13A through 13D may be inserted into the pin holes and the positioning jig 100, 100A or 100B may connect the base plate 1 of the conveying tool 200 for the semiconductor wafer.

Particularly, when constructing a tray conveying system for the semiconductor wafer W1, W2 or W3 including a reflow furnace and automatically mounting the semiconductor wafer W1, W2 or W3 on the conveying tool 200 for the semiconductor wafer, according to the embodiments of the invention, it is possible to position the supporting plates 3 to the opening 9 of the base plate 1 easily and simply without depending on technical skill for the positioning of an experienced person using the position adjusting mechanisms 40. This enables the conveying tool 200 for the semiconductor wafer which can perform the positioning with high accuracy and little variation to be presented.

It is very preferable to apply the invention to a wafer conveying tray which conveys the semiconductor wafer to be heated to the reflow furnace while the semiconductor wafer is mounted thereon, in the tray conveying system for the semiconductor wafer including the reflow furnace that heats a surface of the semiconductor wafer uniformly during the continuous production thereof.

It should be understood by those skilled in the art that various modifications, combinations, sub-combinations and alterations may occur depending on design requirements and other factors insofar as they are within the scope of the appended claims or the equivalents thereof.

The terms and expressions that have been employed in the foregoing specification are used therein as terms of description and not of limitation, and there is no intention in the use of such terms and expressions of excluding equivalents of the features shown and described or portions thereof, it being recognized that the scope of the invention is defined and limited only by the claims which follow.

What is claimed is:

1. A positioning jig for using when adjusting projection positions of supporting members that support a semiconductor wafer having a predetermined dimension into a circular opening of a conveying tool for conveying the semiconductor wafer, the conveying tool including:
   a conveying tool main body containing the opening which has a larger diameter than a diameter of the semiconductor wafer; and
   the supporting members for supporting the semiconductor wafer in a concentric fashion at the projection positions projected from an inner edge of the conveying tool main body into the opening, the supporting members being at least three supporting members and constituting a position adjusting mechanism, each supporting member having a predetermined length, being provided with a plurality of pins arranged thereon corresponding to the diameter of the semiconductor wafer, and being slidably arranged on the conveying tool main body on a straight line toward a center of the opening,
   the positioning jig comprising:
   a positioning jig main body including a circular part with a diameter that is identical with the diameter of the semiconductor wafer and plural protrusion parts protruded from predetermined positions of the circular part to at least three directions; and
   projection portions being respectively provided in the protrusion parts and connecting a periphery portion of the conveying tool main body around the opening, wherein each of the projection portions is arranged at a position that is away from a center of the circular part by a distance that is longer than a radius of the opening, and when adjusting the projection positions of the supporting members so that the pins come into contact with an outer edge of the circular part, the projection portions are installed into the periphery portion of the conveying tool main body.

2. The positioning jig of claim 1, wherein each of the projection portions is a stepped pin which includes a first stepped portion caught by the periphery portion of the conveying tool main body around the opening and a second stepped portion fitted into the opening of the conveying tool main body along the inner edge of the conveying tool main body.

3. A method of adjusting projection positions of supporting members that support a semiconductor wafer having a predetermined dimension into a circular opening of a conveying tool for conveying the semiconductor wafer, the conveying tool including:

a conveying tool main body containing the opening which has a larger diameter than a diameter of the semiconductor wafer; and the supporting members for supporting the semiconductor wafer in a concentric fashion at the projection positions projected from an inner edge of the conveying tool main body into the opening, the supporting members being at least three supporting members and constituting a position adjusting mechanism, each supporting member having a predetermined length, being provided with a plurality of pins arranged thereon corresponding to the diameter of the semiconductor wafer, and being slidably arranged on the conveying tool main body on a straight line toward a center of the opening, the method comprising the steps of:

preparing a positioning jig containing a positioning jig main body including a circular part with a diameter that is identical with the diameter of the semiconductor wafer and plural protrusion parts protruded from predetermined positions of the circular part to at least three directions, and projection portions being respectively provided in the protrusion parts and connecting a periphery portion of the conveying tool main body around the opening, wherein each of the projection portions is arranged at a position that is away from a center of the circular part by a distance that is longer than a radius of the opening;

installing the prepared positioning jig into the periphery portion of the conveying tool main body;

adjusting the projection positions of the supporting members so that the pins come into contact with an outer edge of the circular part of the installed positioning jig; and fixing the adjusted supporting members on the conveying tool main body.

* * * * *